United States Patent

Razon et al.

[11] Patent Number: 6,073,827
[45] Date of Patent: Jun. 13, 2000

[54] WIRE BONDING CAPILLARY WITH A CONICAL SURFACE

[75] Inventors: Eli Razon, Maple Glen, Pa.; Yoram Gal, Kibbutz Yagur, Israel

[73] Assignee: Kulicke & Soffa Investments, Inc., Wilmington, Del.

[21] Appl. No.: 09/141,214

[22] Filed: Aug. 27, 1998

[51] Int. Cl.[7] .............. B23K 37/00; B23K 1/06; B23K 31/00; B23K 31/02
[52] U.S. Cl. .............. 228/4.5; 228/1.1; 228/5.5; 228/180.5
[58] Field of Search .................. 228/180.5, 4.5, 228/1.1, 55

[56] References Cited

U.S. PATENT DOCUMENTS

| | | |
|---|---|---|
| 3,917,148 | 11/1975 | Runyon . |
| 4,513,190 | 4/1985 | Ellett et al. ........................ 219/56.21 |
| 4,974,767 | 12/1990 | Alfaro et al. . |
| 5,111,989 | 5/1992 | Holdgrafer et al. . |
| 5,205,463 | 4/1993 | Holdgrafer et al. . |
| 5,316,204 | 5/1994 | Takehashi et al. .................... 228/179.1 |
| 5,377,894 | 1/1995 | Mizoguchi et al. ..................... 228/1.1 |
| 5,395,035 | 3/1995 | Nakao ...................... 228/4.5 |
| 5,452,841 | 9/1995 | Sibata et al. ......................... 228/180.5 |
| 5,469,011 | 11/1995 | Safabakhsh . |
| 5,540,807 | 7/1996 | Akiike et al. ......................... 156/580.1 |
| 5,558,270 | 9/1996 | Nachon et al. ....................... 228/180.5 |
| 5,586,713 | 12/1996 | Arita et al. .............................. 228/102 |
| 5,626,276 | 5/1997 | Lo et al. .................................. 228/4.5 |
| 5,662,261 | 9/1997 | Fogal ....................... 228/4.5 |
| 5,699,951 | 12/1997 | Miyoshi . |
| 5,735,449 | 4/1998 | Magni ................... 228/180.5 |
| 5,775,567 | 7/1998 | Lo et al. .................................. 228/1.1 |
| 5,791,549 | 8/1998 | Ito ............................................. 228/1.1 |
| 5,791,550 | 8/1998 | Kobayashi ........................... 228/180.5 |

Primary Examiner—Patrick Ryan
Assistant Examiner—Zidia J. Pittman
Attorney, Agent, or Firm—Ratner & Prestia

[57] ABSTRACT

A bonding tool for use with an ultrasonic horn comprising an orifice at a first end of the ultrasonic horn and a capillary having a first tapered end coupled, the first tapered end to the orifice of the ultrasonic horn.

29 Claims, 11 Drawing Sheets

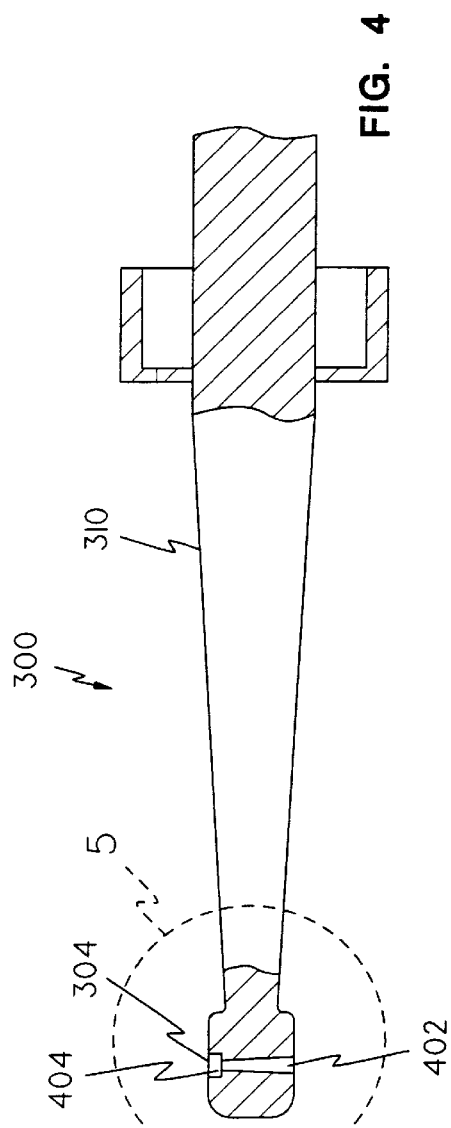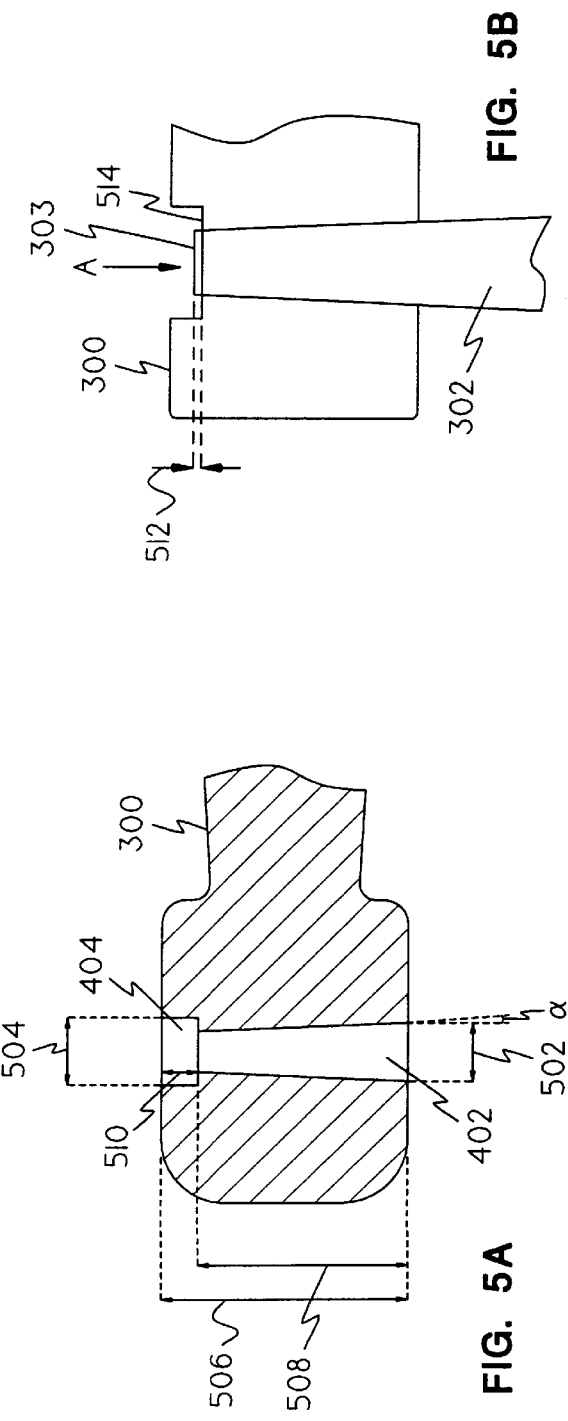

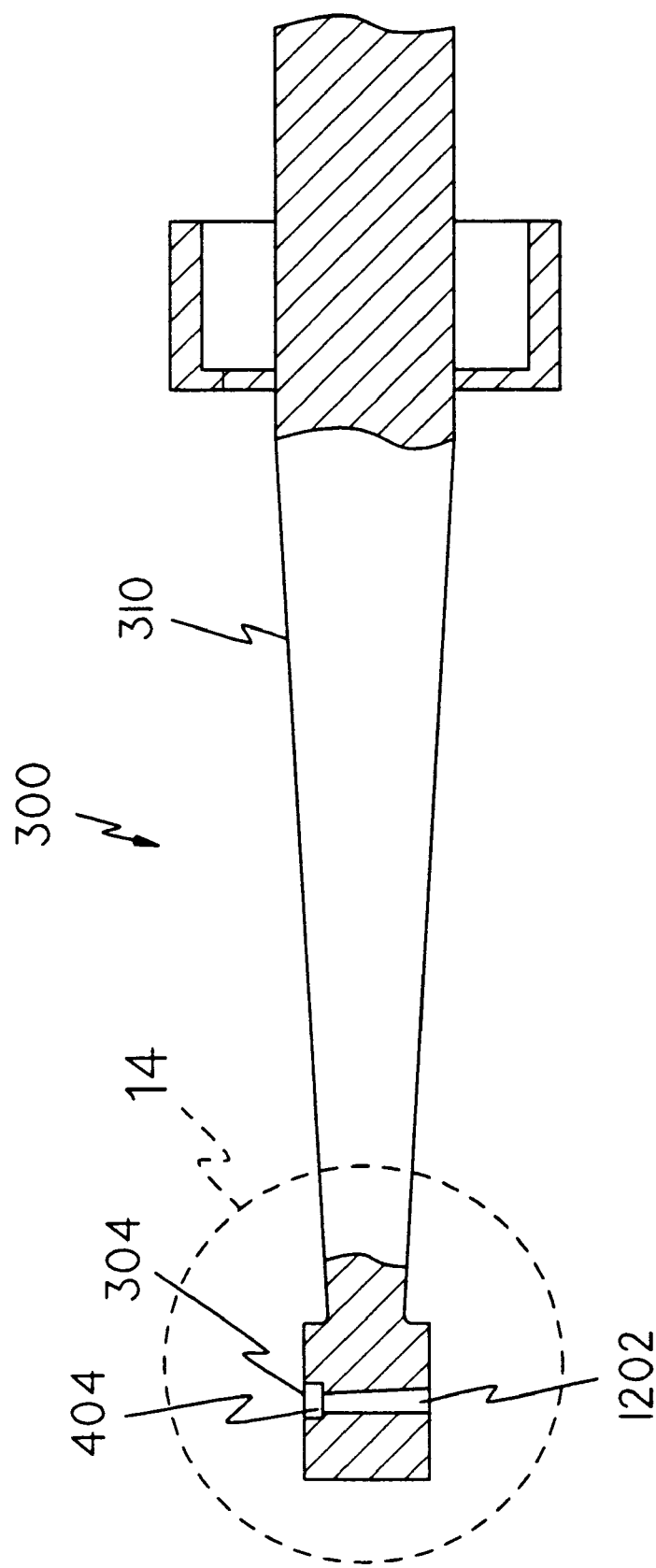

WIRE BONDING CAPILLARY WITH A CONICAL SURFACE

BACKGROUND OF THE INVENTION

This invention relates generally to a tool for use in bonding of wire to semiconductor devices and, more particularly to an ultrasonic horn and a capillary for ball bonding a fine wire to semiconductor devices.

DESCRIPTION OF THE RELATED ART

Modern electronic equipment relies heavily on printed circuit boards on which semiconductor chips, or integrated circuits (ICs), are mounted. The mechanical and electrical connections between the chip and the substrate have posed challenges for chip designers. Three well known techniques for interconnecting the IC to the substrate are: wire bonding, tape automated bonding (TAB) and flip-chip.

The most common of these processes is wire bonding. In wire bonding, a plurality of bonding pads are located in a pattern on the top surface of the substrate, with the chip mounted in the center of the pattern of bonding pads, and the top surface of the chip facing away from the top surface of the substrate. Fine wires (which may be aluminum or gold wires) are connected between the contacts on the top surface of the chip and the contacts on the top surface of the substrate.

A wire bonding apparatus electrically connects a semiconductor chip to a substrate, using metal wires which are widely used in the manufacturing process of electronic components. Particularly, the connecting wires are supplied and bonded to the chip and to the substrate through a capillary, a bonding tool further described below.

Capillaries are used for ball bonding the wire to electronic devices, particularly to bond pads of semiconductor devices. Such capillaries are generally formed from a ceramic material, principally aluminum oxide, tungsten carbide, ruby and other materials. Very thin wire, generally on the order of about one mil gold, copper or aluminum wire, is threaded through an axial passage in the capillary with a small ball being formed at the end of the wire, the ball being disposed external of the capillary tip. The initial object is to bond the ball to a pad on the semiconductor device and then to bond a portion farther along the wire to a lead frame or the like. During the bonding cycle, the capillaries perform more than one function.

After the ball is formed, the capillary must first center the ball partly within the capillary for bond pad targeting. With a first bonding step, the ball is bonded to a pad on a semiconductor device. When the capillary touches the ball down on the bond pad, the ball will be squashed and flatten out. As the bond pads are generally made from aluminum, a thin oxide forms on the surface of the bond pad. In order to form a proper bond, it is preferable to break the oxide surface and expose the aluminum surface. An effective way of breaking the oxide is to "scrub" the surface of the oxide with the wire ball. The wire ball is placed on the surface of the aluminum oxide and the capillary rapidly moves in a linear direction based on the expansion and contraction of a piezo-electric element placed within the ultrasonic horn to which the capillary is attached. The rapid motion, in addition to heat applied through the bond pad, forms an effective bond by transferring molecules between the wire and the bond pad.

The capillary then handles the wire during looping, smoothly feeding the bond wire both out of the capillary and then back into the capillary. The capillary then forms a "stitch" bond and a "tack" or "tail" bond.

A convention method of attaching the capillary to the ultrasonic horn is shown in FIG. 1. In FIG. 1, ultrasonic horn 100 has a hole 112 placed at one end of ultrasonic horn 100. Capillary 102 is attached to ultrasonic horn 100 by placing capillary 102 into hole 112 and forcing capillary 102 against the forward portion of hole 112 with screw 104, nut 106 and sleeve 108. Screw 104 passes through sleeve 108 and attaches to nut 106. The chamfered surfaces 106A and 108A of nut 106 and sleeve 108, respectively, place pressure on capillary 102 as screw 104 is tightened against nut 106. In this way capillary 102 is held in place within ultrasonic horn 100. This attaching method is also known as a "Dutch Key".

FIG. 2 shows a second conventional method of attaching a capillary to an ultrasonic horn. In FIG. 2, the capillary (not shown) is attached to the ultrasonic horn 200 using hole 202. Once the capillary is placed in hole 202 screw 204 is coupled to nut 206 through lateral hole 210. Hole 202 has longitudinal relief portions 214 and 216 that extend from hole 202 as well as orthogonal relief portions 212 lateral to hole 202 forming what is known as a "split clamp". As screw 204 is tightened against nut 206, hole 202 compresses around the capillary clamping the capillary in place.

These approaches, however, have a disadvantage in that the time required to extract and replace the capillary is excessive. In addition, the capillary is a precision device and may be susceptible to damage if screw 104 or 204 is overtightened. Furthermore, tools are necessary to loosen and tighten screw 104 or 204. As the capillary is changed approximately once every shift the time required to change the capillary using the conventional method reduces manufacturing efficiency and affects device production throughput. In addition, the use of a screw, Dutch key, etc., to attach the capillary adds unnecessary mass to the ultrasonic horn which in turn requires additional ultrasonic energy to achieve sufficient displacement for ball bonding operation. This is due, at least in part, to that fact that as a separate element it may have some small motion relative to the transducer which in turn affects the transducer's impedance

SUMMARY OF THE INVENTION

To solve the aforementioned disadvantages of conventional ball bonding tools, the present invention relates to an apparatus that does not require separate means to attach the capillary to the ultrasonic horn.

The apparatus comprises an ultrasonic horn having an orifice formed at an end of the ultrasonic horn and a capillary having a tapered end coupled to the orifice of the ultrasonic horn.

The apparatus further relates to an ultrasonic horn having a tapered orifice with a flat surface formed at an end of the ultrasonic horn and a capillary having a tapered flat end coupled to the orifice of the ultrasonic horn.

The present invention also relates to an ultrasonic horn having greater displacement per unit of ultrasonic energy.

These and other aspects of the invention are set forth below with reference to the drawings and the description of exemplary embodiments of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures:

FIG. 4 is a partial cross sectional view of the ultrasonic horn/capillary assembly of FIG. 3 taken through section 4—4;

FIG. 5A is an enlarged view of a cross section of the ultrasonic horn/capillary assembly of FIG. 4 taken through section 5;

FIG. 5B is an enlarged view of a cross section of the ultrasonic horn/capillary assembly of FIG. 4 taken through section 5 including an installed capillary;

FIG. 12 is a partial cross sectional view of the ultrasonic horn/capillary assembly of FIG. 3 according to another exemplary embodiment of the present invention;

DETAILED DESCRIPTION

Figure 1:
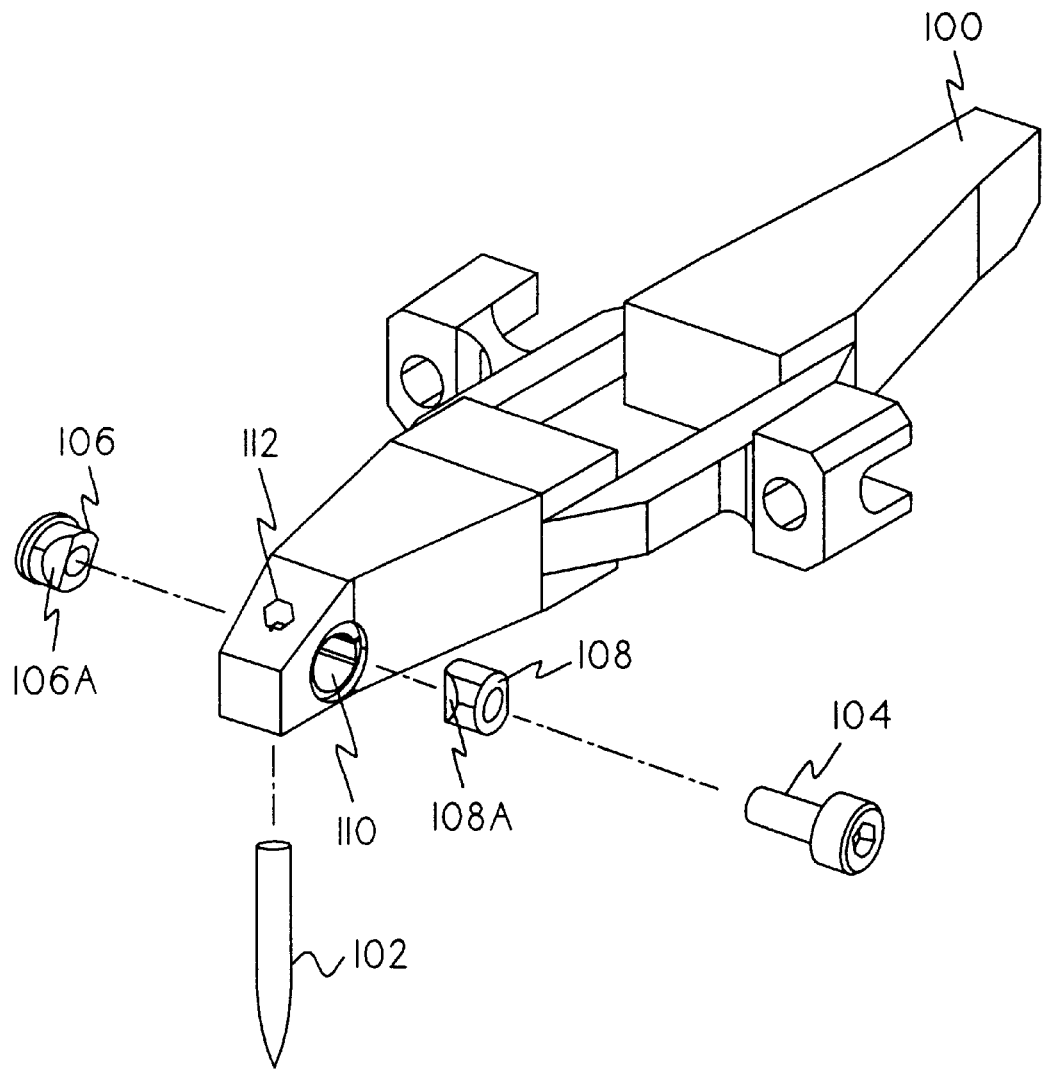
FIG. 1 is a perspective view of a conventional ultrasonic horn/capillary assembly.
Figure 2:
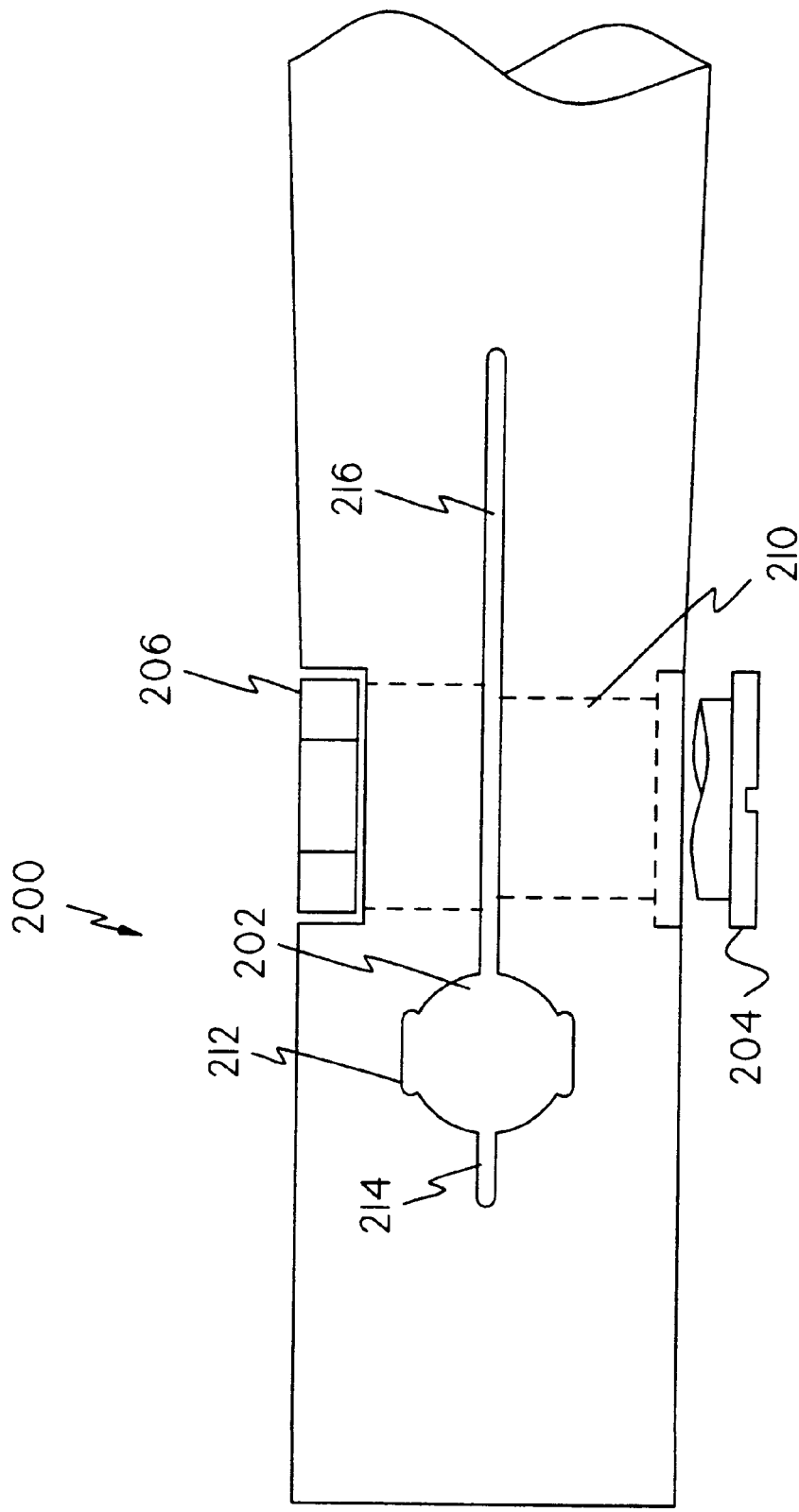
FIG. 2 is a plan view of a portion of a second ultrasonic horn assembly.
Figure 3:
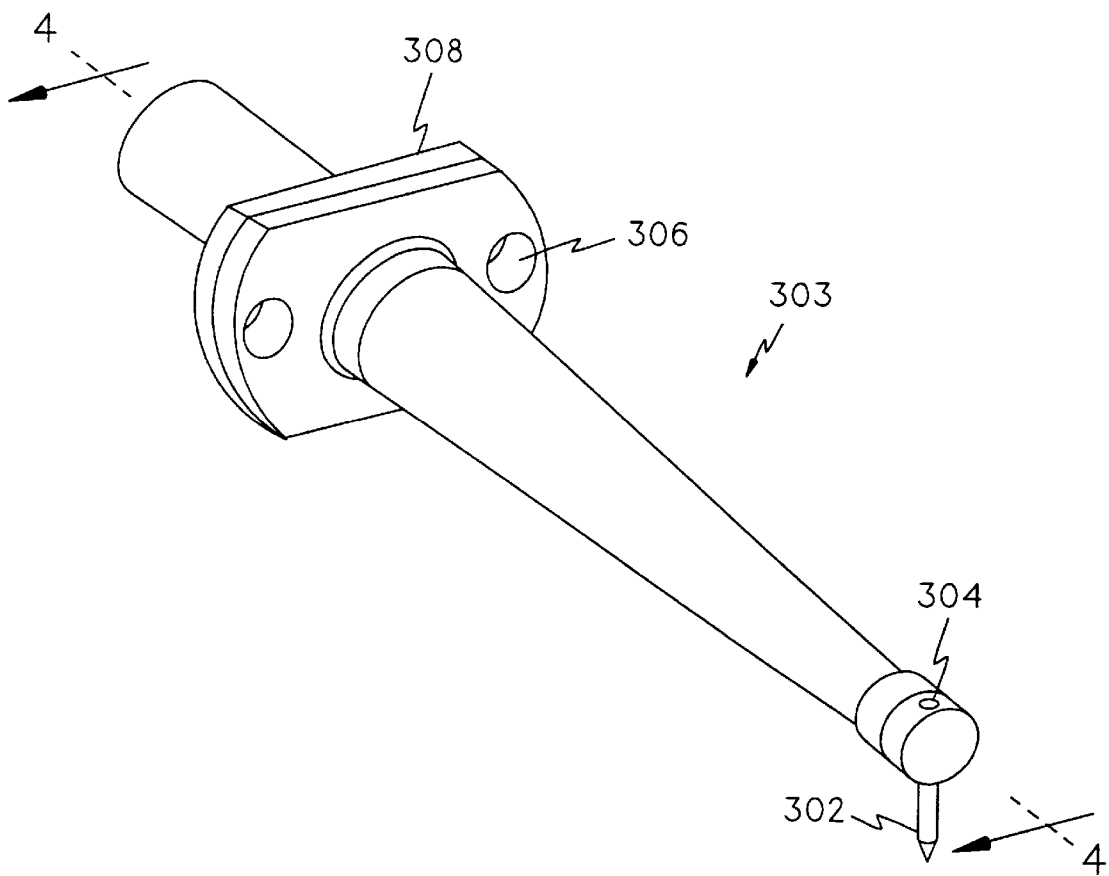
FIG. 3 is a perspective view of a ultrasonic horn/capillary assembly according to an exemplary embodiment of the present invention.

Referring to FIG. 3, a first exemplary embodiment of the present invention is shown. In FIG. 3, ultrasonic transducer 300 is fixedly attached to a wire bonding machine (not shown) at ultrasonic element 308 using fasteners (not shown) engaging the bonding machine through holes 306. At the far end of ultrasonic transducer 300, capillary 302 is mounted by pressfitting capillary 302 into through hole 304. The beam 310 of ultrasonic transducer 300 transfers the high frequency motion induced by ultrasonic element 308 to capillary 302.

Referring to FIG. 4, a partial cross section taken thorough section 4—4 of FIG. 3 is shown. In FIG. 4, through hole 304 has a lower portion 402 and an upper portion 404 connected to one another. As shown in greater detail in FIG. 5A, lower portion 402 may have a conical or wedge shape, for example, to conform with the end of the capillary 302 which is inserted therein. In a preferred embodiment, the lower portion 402 has a conical shape because this affords both ease of manufacturing and possibly greater retention of the capillary. In the exemplary embodiment, the diameter of lower portion 402 at the point of entry into ultrasonic horn 300 may be about 1.583 mm (0.0623 in). The slope α of lower portion 402 may be in the range of about 18:1 to 40:1. Preferably the slope α may be in the range of about 19.95:1 to 20.05:1. Most preferably the slope α may be about 20:1. The depth of hole 402 may be about 3.4 mm (0.134 in) depending on the thickness of ultrasonic horn 300. In the exemplary embodiment, the thickness of ultrasonic horn 300 is about 3.96 mm (0.156 in).

The upper portion 404 may have a diameter 504 of about 2.0 mm (0.079 in) and a depth 510 of about 0.29 mm (0.022 in). The amount of material removed from ultrasonic transducer 300 may be adjusted to compensate for the mass of capillary 302. This may be necessary to avoid a possible imbalance of mass at the antinode of the ultrasonic horn 300.

As shown in FIG. 5B, when capillary 302 is installed in ultrasonic transducer 300, a portion of capillary 302 may extend (protrudes) above the bottom surface 514 of upper portion 404 by a dimension 512. In the exemplary embodiment, the length of dimension 512 by which capillary 302 extends into upper portion 404 is about 0.2 mm (0.008 in.). This protrusion facilitates the removal of capillary 302 from ultrasonic transducer 300 by the application of pressure in direction A to upper surface 303 of capillary 302. Pressure may be applied with a tool (not shown) or other means. The application of pressure will disengage capillary 302 from ultrasonic transducer 300 for removal.

Figure 9:
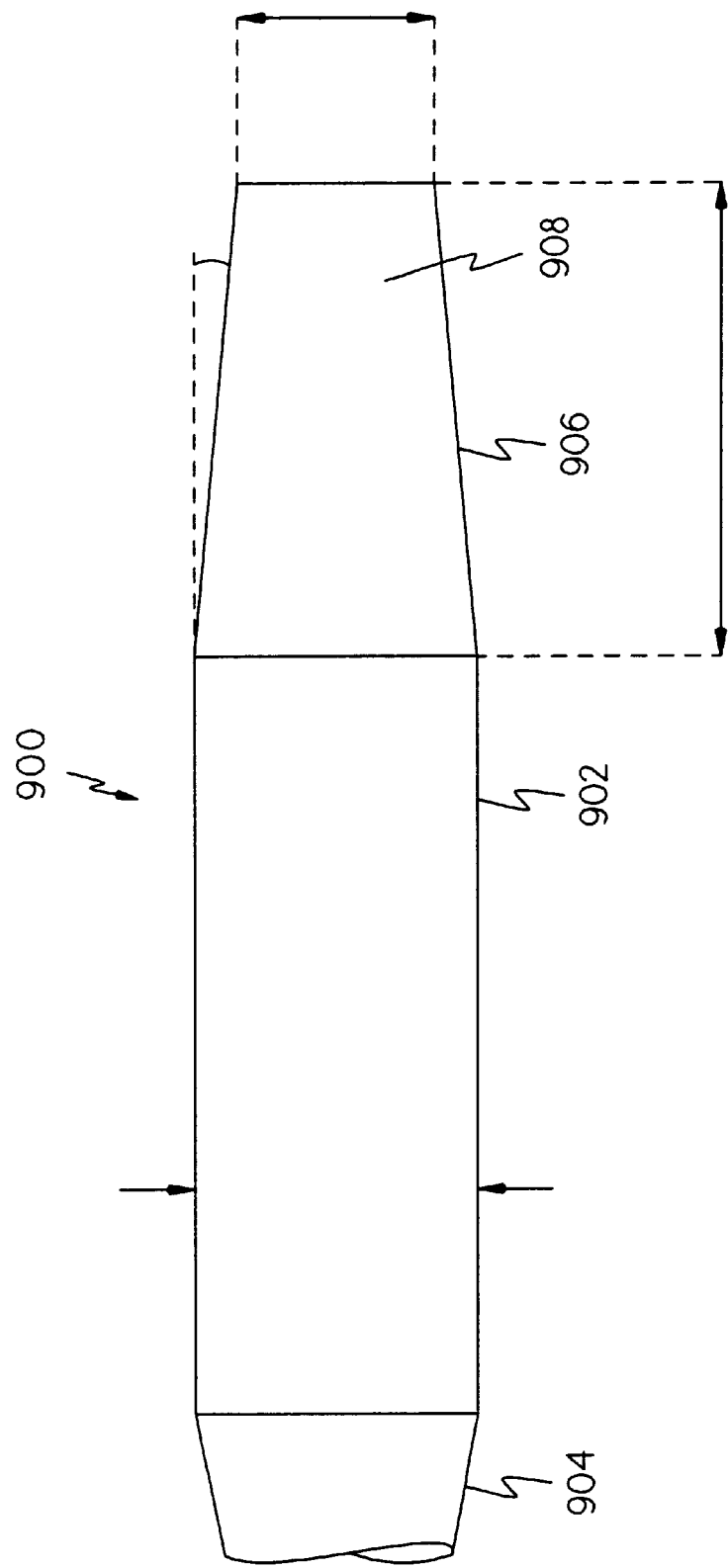
FIG. 9 is a plan view of a portion of the capillary according to an exemplary embodiment of the present invention.

Referring to FIG. 9, a portion of a capillary according to an exemplary embodiment of the present invention is shown. In FIG. 9, capillary 900 has a central portion 902 having a cylindrical shape, a wire delivery portion 904 from which the bonding wire extends through an axial hole (not shown) in capillary 900 for bonding to an integrated circuit, etc., and a mating end 906 which is inserted into an ultrasonic horn, such as ultrasonic horn 300. The capillary may be formed from an alumina material, such as aluminum oxide, tungsten carbide, ruby or ceramic. The central portion 902 may have a diameter of about 1.588 mm (0.0625 in). The mating end 906 may have a wedge, tapered or conical shape to match the shape of hole 402 in ultrasonic horn 300. In the exemplary embodiment, the mating end has a conical shape with a diameter of about 1.216 mm (0.0479 in) and a tapered length of about 3.71 mm (0.146 in). This translates to a slope of about 20:1. The diameter and length of the cone may be selected such that the slope is between about 18:1 and 40:1 and consistent with the aforementioned mating hole 402 formed in ultrasonic transducer 300.

The capillary 900 may be formed from a unitary piece of material where the capillary initially is a cylinder and conical section 906 is formed by removing excess material as necessary to form the cone. In a similar fashion, conical section 904 may also be formed by removing material from cylinder 902. If desired, the transition between the conical sections 904, 906 and the cylindrical section 902 may be continuous or may incorporate at transition, such as a step, ridge or ledge.

Figure 6:
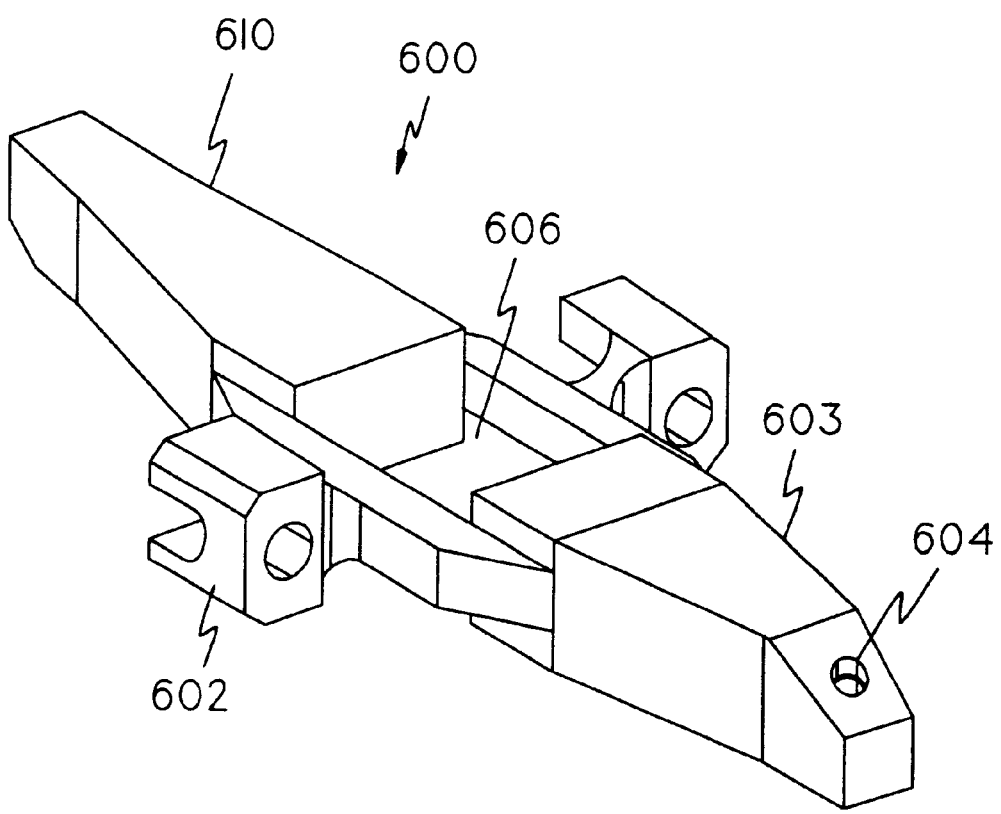
FIG. 6 is a perspective view of an ultrasonic horn according to a second exemplary embodiment of the present invention.

Referring now to FIG. 6, a second exemplary ultrasonic horn of the present invention is shown. In FIG. 6, ultrasonic horn 600 has an orifice 604 formed at one end. Orifice 604 extends from the top to the bottom of ultrasonic horn 600. The rear portion 610 of ultrasonic horn 600 is attached to the bonding machine at flange 602. An ultrasonic element (not shown) is located in area 606. The ultrasonic element imparts longitudinal motion to the ultrasonic transducer 600. This longitudinal motion in turn scrubs the capillary and bonding wire across the pad of an integrated circuit or other device.

Figure 7:
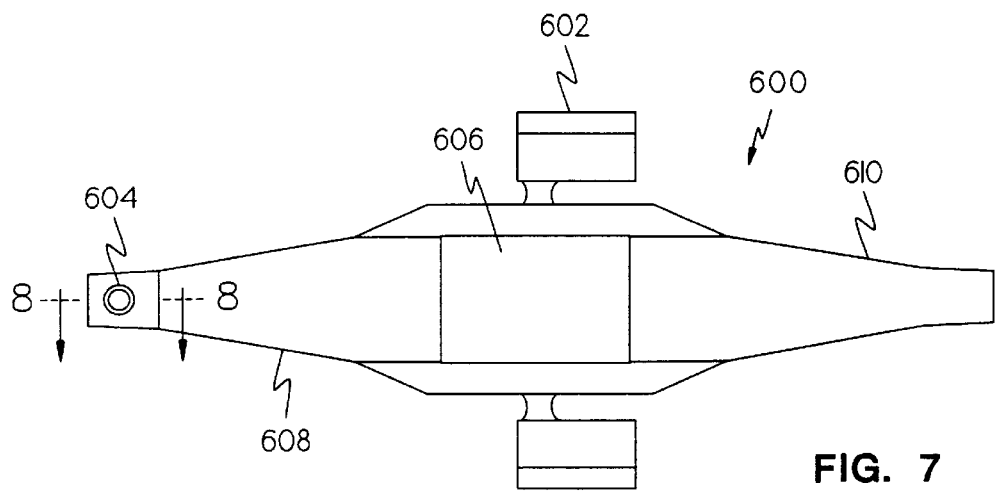
FIG. 7 is a plan view of the ultrasonic horn of FIG. 6.

FIG. 7 is a plan view of ultrasonic horn 600. In FIG. 7, orifice 604 is central located with respect to the transverse dimension of ultrasonic horn 600 to maintain proper lateral balance of ultrasonic horn 600.

Figure 8:
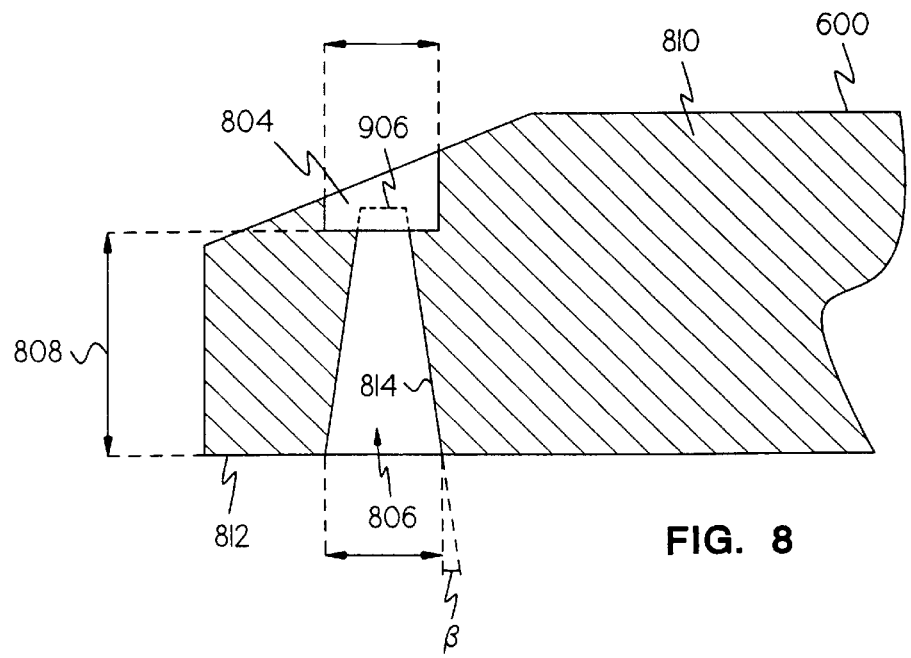
FIG. 8 is a partial cross sectional view of the ultrasonic horn of FIG. 7 taken through section 8—8.

FIG. 8 is a partial cross sectional view of ultrasonic horn 600 taken through section 8—8 of FIG. 7. As shown in FIG. 8, orifice 604 has a lower portion 806 and an upper portion 804, similar to that of ultrasonic horn 300 discussed above. Lower portion 806 may also be tapered if desired where the slope of the taper is about 20:1. The lower portion 806 mates with upper portion 804 such that orifice 604 is a through hole extending from the top surface 810 to the bottom surface 812 of ultrasonic horn 600. Upper portion 804 may have the shape of a counter bore with a diameter of about 2.0 mm (0.79 in). The depth of upper portion 804 is such that an upper portion of the capillary 906 (shown in phantom) may extend into the upper portion 804 to facilitate the removal of capillary 900 by exerting force on the upper portion 906 of capillary 900. Such force may be provided by a specially designed manual tool, an automatic insertion/removal mechanism, or another device such as a drift pin.

Preferably surface 814 of lower portion 806 and/or surface 908 of capillary 900 are formed such that adequate frictional force is provided between capillary 900 and ultrasonic horn 300, 600. If the surfaces are too smooth it is possible that capillary 900 may become dislodged from ultrasonic horn 300, 600 during the wire bonding process possibly causing damage to the devices being bonded.

Figure 10A:
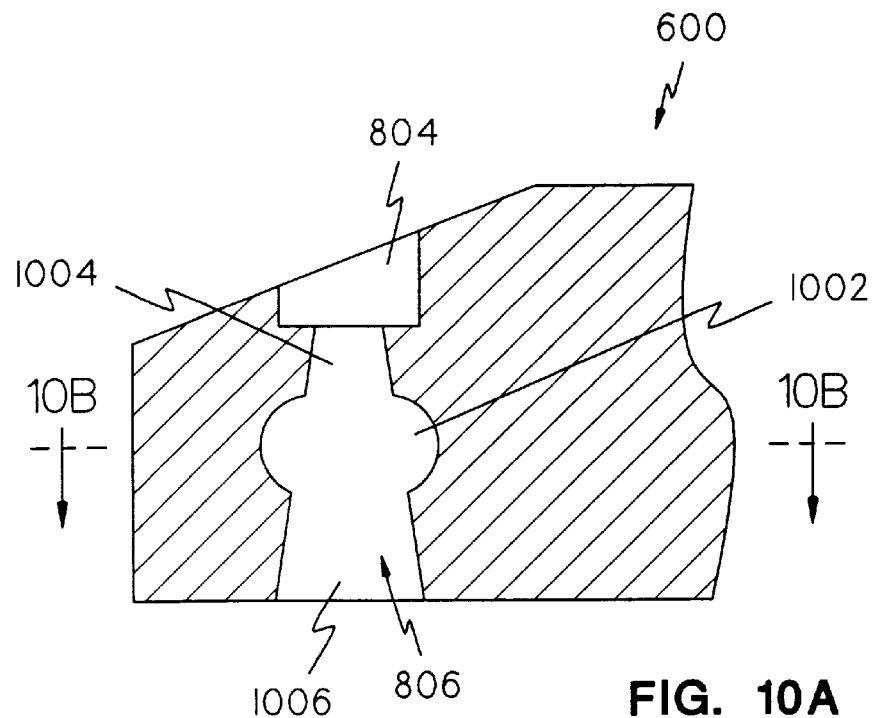
FIGS. 10A–10B are a plan view and a cross sectional view, respectively, of an ultrasonic horn according to another exemplary embodiment of the present invention.
Figure 10B:
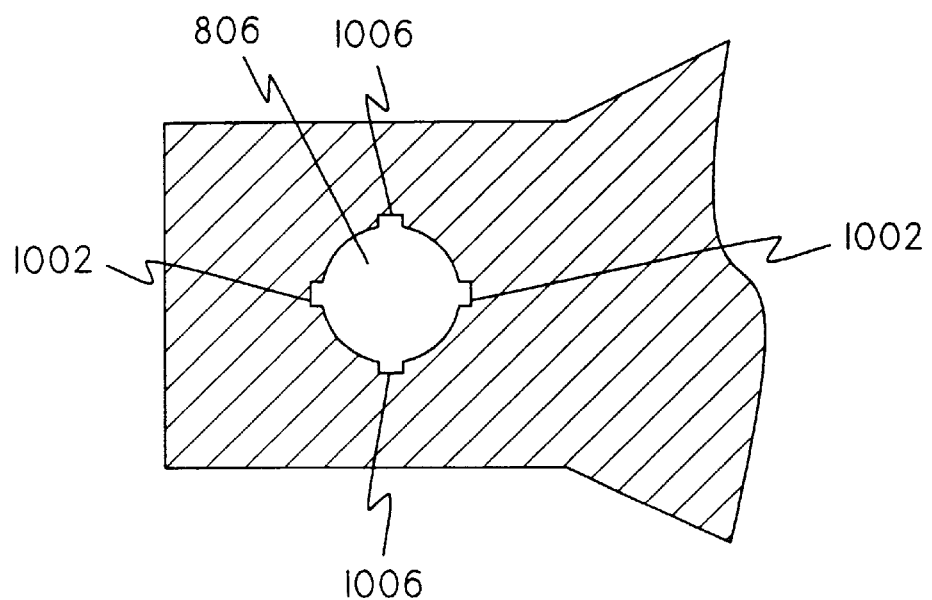

Referring now to FIG. 10A, another exemplary embodiment of the present invention is shown. In FIG. 10A, lower portion 806 is formed from two truncated conical portions 1004 and 1006 separated by recess 1002. The addition of recess 1002 may allow for a more secure fit of capillary 900 within ultrasonic horn 300, 600 by providing relief between the respective surfaces. As shown in FIG. 10B, recess 1002 may be formed on two sides of lower portion 806, for example. In addition, recess 1002 may be placed at any position along the circumference of lower portion 806. If desired addition recesses 1006 may be added to further increase the relief between the truncated conical portion 1004, 1006.

The elimination of screws 104, etc. as attaching means for capillary 900 reduces the mass of ultrasonic horn 600, 900. This reduced mass has an impact on the amount of energy necessary to displace ultrasonic horn 600, 900 during bonding operations. In addition to added mass, screws 104, etc. create addition independent vibration and/or other movement within the transducer. This vibration or movement dissipates significant amounts of energy, and creates variations between transducers. The amount of energy (i.e., transducer impedance) changes, at a minimum, each time a capillary is changed and may also change when the transducer is opened and closed. The ultrasonic horns of exemplary embodiments overcome these deficiencies.

Referring once again to FIG. 3, ultrasonic element 308 is contained within ultrasonic horn 300, for example. The impedance of ultrasonic element 308, required to provide adequate displacement of prior art ultrasonic horns, is on the order of 50 ohms. As the mass of ultrasonic transducer 600, 900 is reduced (such as by eliminating the capillary attaching screws), less energy is required to provide adequate displacement of ultrasonic horn 600, 900. This in turn reduces the impedance of ultrasonic element 308. It is contemplated that the impedance of an ultrasonic element for use with the improved ultrasonic horn will reduce the impedance of the ultrasonic horn and enable a more efficient transfer of energy.

Figure 13B:
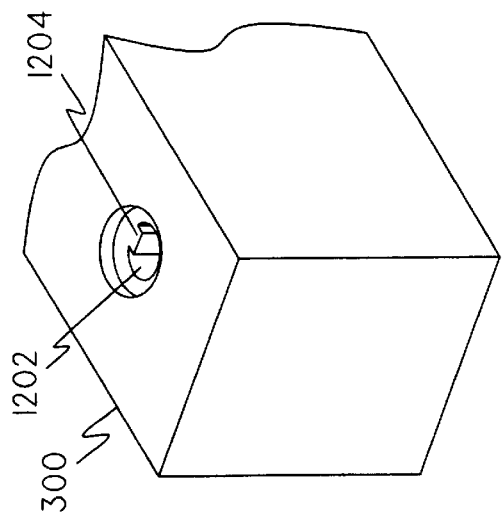
FIG. 13B is a perspective view of an end portion of the ultrasonic horn of FIG. 12.
Figure 13A:
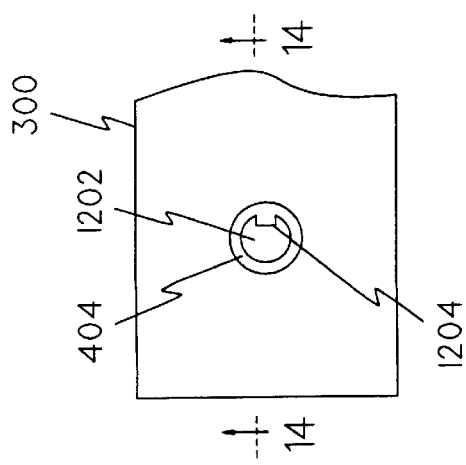
FIG. 13A is a plan view of an end portion of the ultrasonic horn of FIG. 12.
Figure 14:
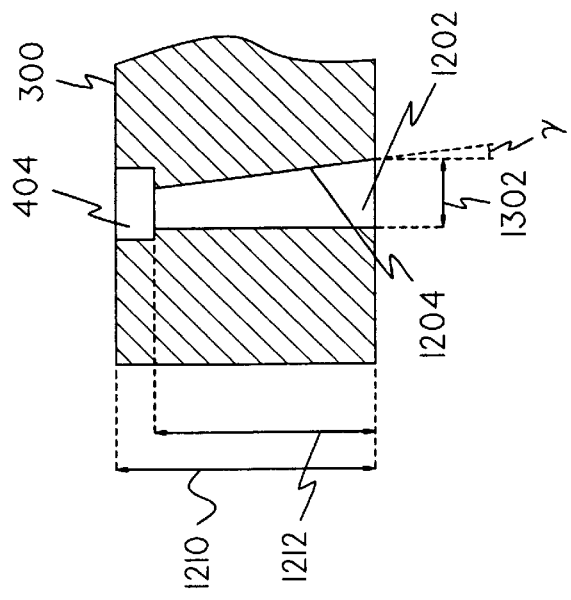
FIG. 14 is a partial cross sectional view of the ultrasonic horn of FIG. 13A taken through section 14—14.

Referring to FIG. 12 a partial cross section similar to section 4—4 of FIG. 3 is shown. In FIG. 12, elements identical to those shown in FIG. 4 are shown with identical reference numerals. In FIG. 12, the only difference between the embodiment shown in FIG. 4 is the replacement of tapered orifice 402 with beveled orifice 1202. FIG. 13A is a plan view and FIG. 13B is a perspective view, respectively, of the end portion of ultrasonic transducer 300. As shown in FIGS. 13A and 13B, orifice 1202 has a beveled face 1204. The shape of orifice 1202 conforms with the beveled end of capillary 1102 (shown in FIG. 11) which is inserted therein. FIG. 14 is a partial cross-sectional view of the end of ultrasonic horn 300 taken through section 14—14 of FIG. 13A. As shown in FIG. 14, the diameter 1302 of beveled orifice 1202 at the point of entry into ultrasonic horn 300 may be about 1.583 mm (0.0623 in). The slope α of beveled orifice 1202 may be in the range of about 18:1 to 40:1. Preferably the slope α may be in the range of about 19.95:1 to 20.05:1. Most preferably the slope α may be about 20:1. The depth of hole 1202 (shown as dimension 1212) may be about 3.4 mm (0.134 in) depending on the thickness of ultrasonic horn 300. As mentioned above, the thickness of ultrasonic horn 300 (shown as dimension 1210) may be about 3.96 mm (0.156 in).

Figure 11:
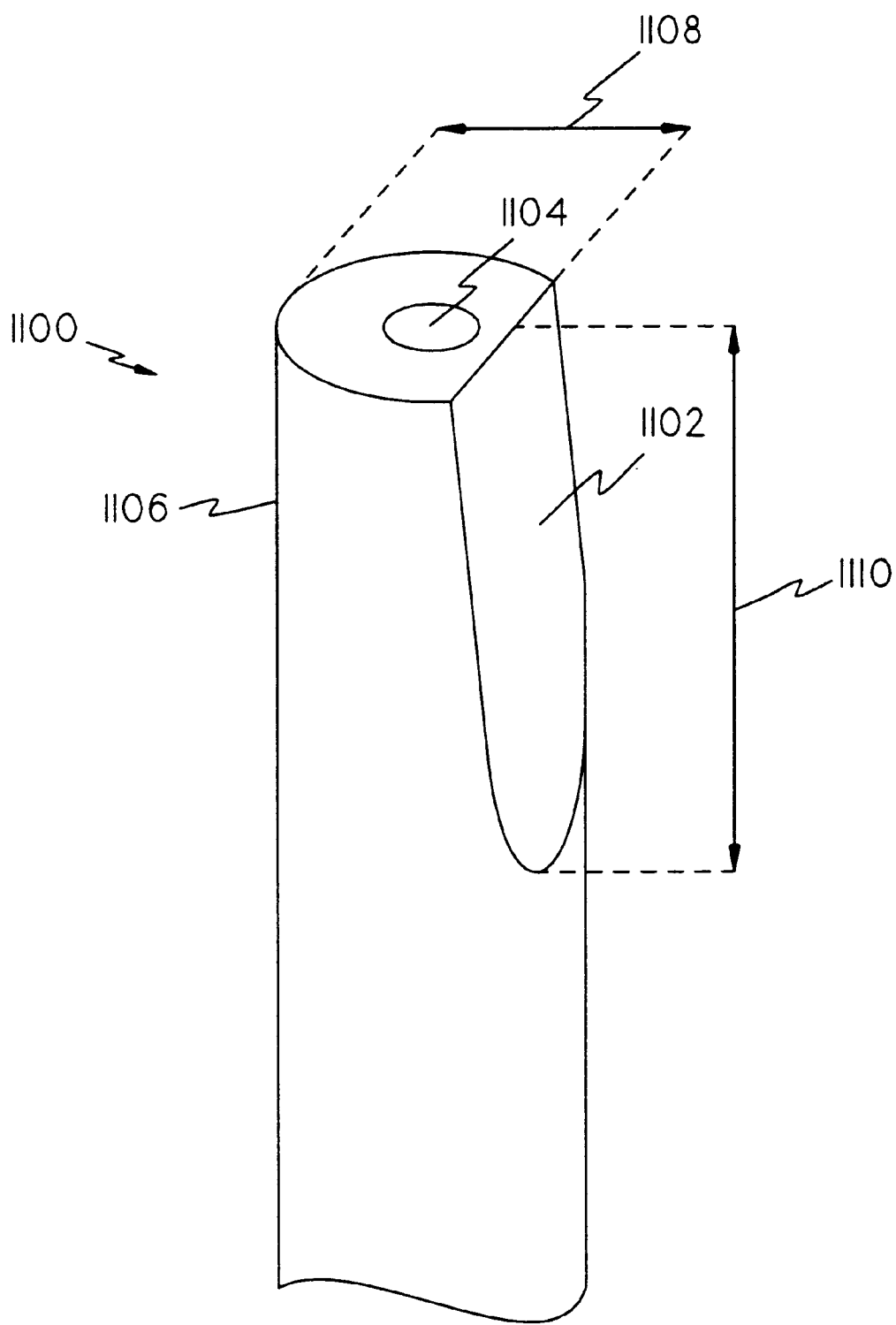
FIG. 11 is a partial perspective view of a capillary according to another exemplary embodiment of the present invention.

Referring to FIG. 11, a portion of a capillary according to another exemplary embodiment of the present invention is shown. In FIG. 11, capillary 1100 has a cylindrical shape, a wire delivery portion (not shown) from which the bonding wire extends through an axial hole 1104 in capillary 1100 for bonding to an integrated circuit, etc., and a mating end 1106 which is inserted into an ultrasonic horn, such as ultrasonic horn 300. The capillary may be formed from an alumina material, such as aluminum oxide, tungsten carbide, ruby or ceramic. The capillary 1100 may have a diameter of about 1.588 mm (0.0625 in). The mating end 1106 may have a beveled surface 1102 to match the shape of orifice 1202 in ultrasonic horn 300 (as shown in FIG. 12). In this exemplary embodiment, the mating end has a beveled shape with a cross sectional dimension 1108 of about 1.372 mm (0.054 in) and a length 1110 of about 4.318 mm (0.170 in). This translates to a slope of about 20:1. The diameter and length of the cone may be selected such that the slope of the beveled surface 1102 is between about 18:1 and 40:1 and consistent with the aforementioned mating orifice 1202 formed in ultrasonic transducer 300 (as shown in FIG. 12).

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A ball bonding tool for use with an ultrasonic horn for attachment of wires to a microcircuit device, the tool comprising:

an orifice at a first end of the ultrasonic horn; and a capillary having a first tapered end, the first tapered end coupled to the orifice of the ultrasonic horn.

2. A ball bonding tool according to claim 1, wherein the first tapered end has a slope in the range of about 18:1 and 40:1.

3. A ball bonding tool according to claim 1, wherein the first tapered end has a slope in the range of about 19.95:1 and 20.05:1.

4. A ball bonding tool according to claim 1, wherein the first tapered end has a slope of about 20:1.

5. A ball bonding tool according to claim 1, wherein i) the capillary has a diameter of about 1.588 mm (0.0625 in) and ii) the first tapered end has a diameter of about 1.25 mm (0.049 in) and a length about 3.71 mm (0.146 in).

6. A ball bonding tool according to claim 1, wherein the orifice of the ultrasonic horn extends from a top surface to a bottom surface of the ultrasonic horn.

7. A ball bonding tool according to claim 6, wherein a bottom portion of the orifice is formed in a taper approximately identical to the first tapered end of the capillary and a top portion of the orifice is a counterbore having a flat bottom surface coupled to the bottom portion of the orifice.

8. A ball bonding tool according to claim 7, wherein the taper of the orifice has a diameter of approximately 1.58 mm (0.0623 in) at the bottom surface of the ultrasonic horn and a depth of approximately 3.40 mm (0.134 in), and the counterbore has a diameter of approximately 2.00 mm (0.079 in).

9. A ball bonding tool according to claim 7, wherein the capillary is formed from at least one of the group consisting of aluminum oxide, tungsten carbide, ruby and ceramic.

10. A ball bonding tool according to claim 1, wherein a first mating surface of the capillary is coupled to a second mating surface of the orifice.

11. A ball bonding tool according to claim 10, wherein the first mating surface locks to the second mating surface based on friction between the first mating surface and the second mating surface.

12. A ball bonding tool according to claim 10, wherein the first mating surface and the second mating surface are rough surfaces.

13. A ball bonding tool according to claim 1, wherein the first tapered end has a wedge shape.

14. A ball bonding tool according to claim 1, wherein the orifice has a first portion and a second portion disposed above the first portion of the orifice, the capillary protrudes from the first portion of the orifice into the second portion of the orifice, such that the capillary may be extracted from the ultrasonic horn by applying pressure to an upper portion of the capillary.

15. An apparatus for use with a ball bonding tool for attachment of wires to a microcircuit device, the apparatus comprising:

an ultrasonic horn having an orifice extending from a top surface to a bottom surface of the ultrasonic horn; and a capillary having a first tapered end, the first tapered end coupled to the orifice of the ultrasonic horn.

16. The apparatus according to claim 15, wherein the orifice has i) a first conical portion extending from the bottom surface of the ultrasonic horn, ii) a cylindrical portion extending from the top surface of the ultrasonic horn, and iii) a second conical portion interposed between the first conical portion and the cylindrical portion of the ultrasonic horn.

17. The apparatus according to claim 16, wherein a surface of the first tapered end of the capillary is coupled to at least a portion of at least one of the first conical portion and the second conical portion of the ultrasonic horn.

18. A ball bonding tool for use with a capillary for attachment of wires to a microcircuit device, the capillary having a first tapered end, the tool comprising:

an ultrasonic horn having a single orifice formed at one end and extending from a top surface to a bottom surface of the ultrasonic horn, wherein the single orifice of the ultrasonic horn is coupled to the first tapered end of the capillary.

19. A ball bonding tool according to claim 18, further comprising:

a piezo-electric element coupled to the ultrasonic horn, wherein the ultrasonic horn at least one of extends and contracts along a longitudinal axis responsive to energizing the piezo-electric element.

20. A capillary for use with a ball bonding tool for attachment of wires to a microcircuit device, the capillary comprising:

a first tapered section having i) a first end with a first diameter and ii) a second end with a second diameter greater that the first diameter;

a cylindrical section having a first end coupled to the second end of first tapered section; and a second tapered section coupled to a second end of the cylindrical section.

21. The capillary according to claim 20, wherein the cylindrical section has a uniform diameter equal to the second diameter of the first conical section.

22. The capillary according to claim 20, wherein the capillary is formed from a unitary piece of material.

23. A ball bonding tool for use with an ultrasonic horn for attachment of wires to a microcircuit device, the tool comprising:

an orifice at a first end of the ultrasonic horn; and a cylindrical capillary having a beveled end portion coupled to the orifice of the ultrasonic horn.

24. A ball bonding tool according to claim 23, wherein the beveled end portion has a slope in the range of about 18:1 and 40:1.

25. A ball bonding tool according to claim 23, wherein the beveled end portion has a slope in the range of about 19.95:1 and 20.05:1.

26. A ball bonding tool according to claim 23, wherein the beveled end portion has a slope of about 20:1.

27. A ball bonding tool according to claim 23, wherein the orifice of the ultrasonic horn extends from a top surface to a bottom surface of the ultrasonic horn.

28. A ball bonding tool according to claim 27, wherein a bottom portion of the orifice is formed with a bevel approximately identical to the beveled end portion of the capillary and a top portion of the orifice is a counterbore having a flat bottom surface coupled to the bottom portion of the orifice.

29. A ball bonding tool according to claim 23, wherein the orifice has a first portion and a second portion disposed above the first portion of the orifice, the capillary protrudes from the first portion of the orifice into the second portion of the orifice, such that the capillary may be extracted from the ultrasonic horn by applying pressure to an upper portion of the capillary.

* * * * *

UNITED STATES PATENT AND TRADEMARK OFFICE
CERTIFICATE OF CORRECTION

PATENT NO. : 6,073,827
DATED : June 13, 2000
INVENTOR(S) : Eli Razon; and Yoram Gal It is certified that error appears in the above-identified patent and that said Letters Patent is hereby corrected as shown below:

On the cover page of the Letters Patent, item [57] Abstract, line 3, should read "having a first tapered end the first tapered end coupled to the".

Signed and Sealed this

Twelfth Day of June, 2001

*Attest:*

*Attesting Officer*

NICHOLAS P. GODICI
*Acting Director of the United States Patent and Trademark Office*